United States Patent
Deml et al.

(10) Patent No.: US 7,643,341 B2
(45) Date of Patent: Jan. 5, 2010

(54) INTEGRATED CIRCUIT HAVING A MEMORY ARRANGEMENT

(75) Inventors: Christoph Deml, Munich (DE);
Thomas Liebermann, Munich (DE);
Edvin Paparisto, Munich (DE)

(73) Assignee: Infineon Technologies AG, Neubiberg (DE)

( * ) Notice: Subject to any disclaimer, the term of this patent is extended or adjusted under 35 U.S.C. 154(b) by 337 days.

(21) Appl. No.: 11/680,357

(22) Filed: Feb. 28, 2007

(65) Prior Publication Data

US 2007/0223284 A1 Sep. 27, 2007

(30) Foreign Application Priority Data

Mar. 2, 2006 (DE) .................. 10 2006 009 746

(51) Int. Cl.
*G11C 11/34* (2006.01)
*G11C 16/04* (2006.01)
*G11C 5/06* (2006.01)

(52) U.S. Cl. ..................... 365/185.05; 365/185.11; 365/63

(58) Field of Classification Search ........... 365/185.05, 365/185.11, 63
See application file for complete search history.

(56) References Cited

U.S. PATENT DOCUMENTS 6,662,263 B1 * 12/2003 Wong .................... 711/103
2007/0233944 A1 * 10/2007 Mori et al. ............... 711/112

* cited by examiner

*Primary Examiner*—Ly D Pham
(74) *Attorney, Agent, or Firm*—Dicke, Billig & Czaja, PLLC

(57) ABSTRACT

An integrated circuit having a memory arrangement is disclosed. In one embodiment, the memory arrangement includes a plurality of memory cells, a delete line for deleting the memory cells, and a read line for reading out the memory cells. There are either provided separate lines as delete line and as read line, or the same line serves both as delete line and as read line. The memory cell arrangement includes at least one delete memory sector and at least one read memory section. The number of memory cells of at least one delete memory sector does not concur with the number of memory cells of at least one read memory sector.

24 Claims, 4 Drawing Sheets

INTEGRATED CIRCUIT HAVING A MEMORY ARRANGEMENT

CROSS-REFERENCE TO RELATED APPLICATIONS

This Utility Patent Application claims priority to German Patent Application No. DE 10 2006 009 746.7 filed on Mar. 2, 2006, which is incorporated herein by reference.

BACKGROUND

The present invention relates to an integrated circuit having a a memory cell arrangement.

A plurality of memory cells usually forms a matrix of semiconductor memory cells. Each cell can be controlled separately via a word line and a bit line.

In particular flash memories or EEPROM cells could be used as memory cells. The designation EEPROM is an English abbreviation of "Electrically Erasable Programmable Read-Only Memory". This is a non-volatile memory, i.e. the memory information is preserved even if the memory is not supplied with energy. The memory content may be programmed by electric pulses.

The memory cell of an EEPROM consists of a field effect transistor including a floating gate. The floating gate is a conductor portion above the source drain channel of the EEPROM cell. It is electrically insulated from its surrounding, so that charges present on the floating gate cannot flow off easily. The programming of the memory cell is performed in that charges are applied on the floating gate or removed from the floating gate.

The charge present on the floating gate generates a voltage that increases or decreases the channel between the source and the drain of the EEPROM cell, i.e. the conductivity of the source drain channel is influenced by the floating gate. For reading out the memory information, for instance, a constant voltage is applied to the bit line of the memory cell which is connected with the drain. The source of the EEPROM cell is connected with the ground. The control gate of the EEPROM cell is usually controlled with a read-out voltage. Subsequently, the current flowing from drain to source is measured. The current intensity measured is a measure of how strongly the floating gate is charged.

In the uncharged state of the floating gate, current may flow through the source drain path (the channel) of the EEPROM cell. To this end, a suitable (relatively low) voltage has to be applied to the control gate. If the floating gate is charged with electrons, the channel is closed. The negative potential of the electrons on the floating gate prevents electrons from flowing through the adjacent channel. No current flows in the bit line.

The control gate of each memory cell may, for instance, be controlled to select a particular memory cell. For reading out the particular memory cell, a voltage is usually applied to the bit lie; the source is, for instance, connected with the ground. The current flow in the bit line is, for instance, collected to determine whether the floating gate is charged or not. A charged floating gate normally prevents the current flow through the channel of the selected memory cell.

Prior to the writing of switched EEPROM cells of a memory sector, all memory cells are usually first of all deleted. A high potential difference between the control gate and the source/drain channel may, for instance, be used to cause a programming or deletion of the memory cell. Depending on the polarity of the potential difference, the electrons are removed from the floating gate or applied to the floating gate. After deletion, the individual memory cells of the memory sector can be written by the respective control gates. For controlling, the respective cells are usually selectively connected by read switches with the read line and by delete switches with the delete line.

The different switches are necessary since the delete voltages for the removal of charges from the floating gates are distinctly higher than the read voltages. Usually, the delete voltages have a magnitude of approx. 5 to 20 volts. The read voltages are usually smaller than 2 volts. The intensity of the delete voltage is, however, solely predetermined by the EEPROM cells. The voltage that is sufficient to discharge or charge the floating gate may be designated as delete voltage or programming voltage of the memory cell. Read voltage is the voltage that is sufficient or used to read out the memory content of the EEPROM cell without changing the charge on the floating gate.

As delete switches, transistors are used, whose breakthrough voltage across the source/drain channel lies above the delete voltage. Such a transistor is, as a rule, larger than a transistor with a lower breakthrough voltage. Furthermore, higher control voltages are necessary at the gate of the transistor to switch the transistor. The gate voltage of the delete transistor required for switching is, for instance, in the range of 10 volts. For controlling the delete switches, level shifters are required which convert the usually relatively low control voltage of 1 to 2 volts to the required voltage of the gate of the delete switch. The level shifter is a relatively slowly switching component, so that the delete switches cannot be controlled as quickly as the read switches. As a rule, the delete switches are consequently slower and larger vis-à-vis the read switches. The delete switches are, however, required for the higher delete voltages.

The known parallel circuit of several EEPROM cells has the advantage that the number of delete and read switches for controlling the EEPROM cells can be reduced. Thus, the size and complexity of the circuit are reduced and the costs are decreased. It is an advantage of the prior known circuit configuration that entire memory sectors first of all have to be deleted for programming the circuit. This disadvantage is, however, not a grave one if the memory arrangement is programmed very rarely.

The known EEPROM memory arrangement may, for instance, be used as read only memory in which a program for controlling a vehicle system (e.g., the motor control or the anti blocking system) is stored. Such a program is rewritten rarely, so that the large delete granularity does not carry weight. On the other hand, such a program is to be executable as quickly as possible. This is because in particular an anti blocking system is to detect and remedy the blocking of a tire as quickly as possible. Consequently, it must be possible to read out the memory cells quickly so as to be able to execute the program. The number of parallel-connected memory cells does, however, increase the capacitance of the connected line and thus the access time to the individual memory cells. The requirement of quick memory access is thus in contradiction to the desire of providing a circuit that is as small and as cost-efficient as possible.

For these and other reasons, there is a need for the present invention.

SUMMARY

One embodiment provides an integrated circuit having a memory arrangement. The integrated circuit having a delete/read line, a delete memory sector having memory cells, a read memory sector having memory cells, wherein the number of memory cells of the delete memory sector is different from the number of memory cells of the read memory sector.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
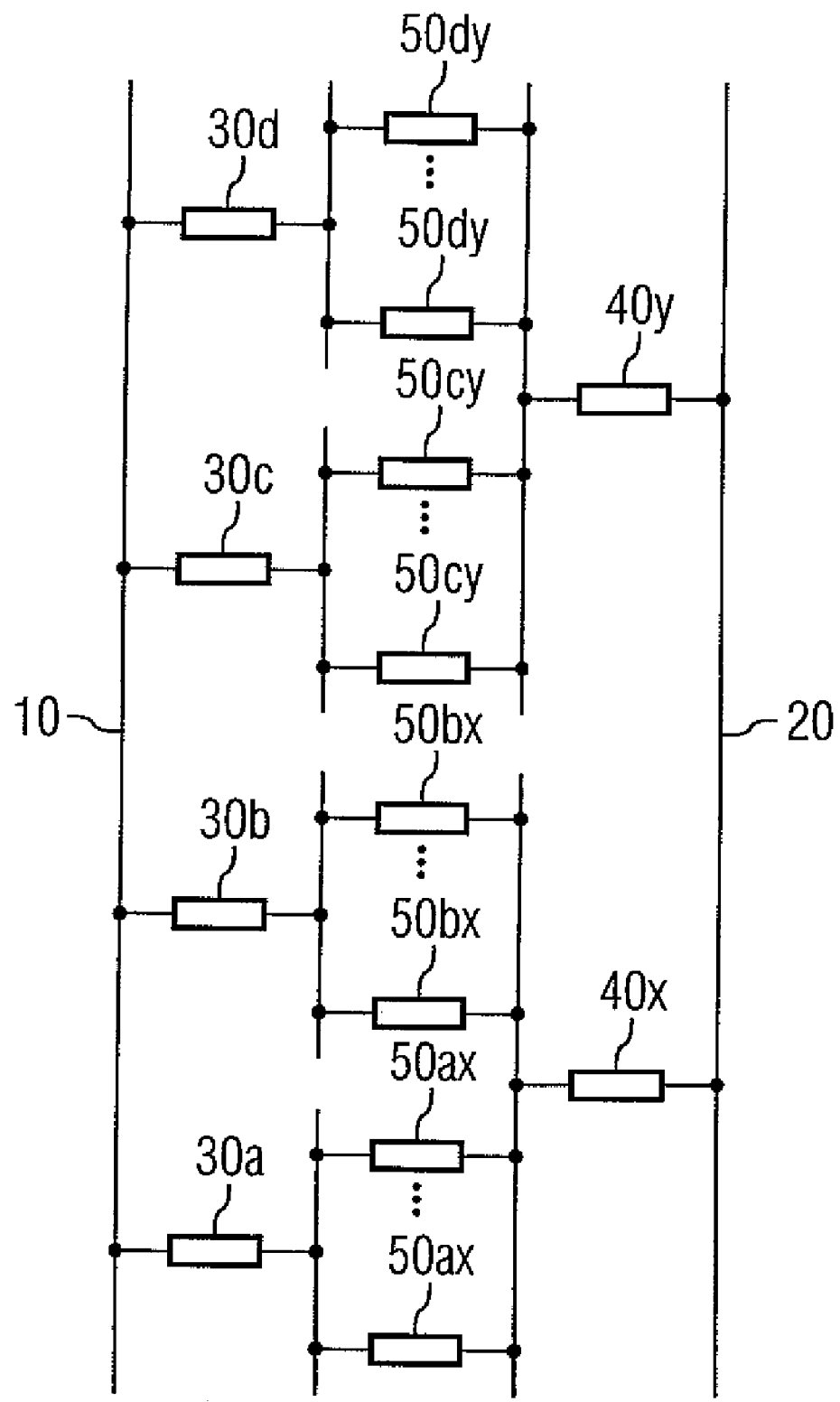
FIG. 1 illustrates a memory arrangement of a first preferred embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a memory cell arrangement that is cost-efficient and enables quick access to the memory cells.

The solution is based on the finding that there exist different optima for the read access time and the delete granularity. The required access times depend on the specific use. Conventionally, however, the memory structure is determined by the delete granularity. This means that the number of memory cells connected to the delete lines corresponds to the number of memory cells during reading.

In one embodiment, the integrated circuit having an inventive memory cell arrangement includes a plurality of memory cells. A delete line for deleting the memory cells and a read line for reading out the memory cells are provided. One single line or else two different lines may be provided as delete line and as read line. Furthermore, a number of at least one delete memory sector is provided. Each delete memory sector includes an amount of the memory cells. A delete memory sector constitutes the smallest number of memory cells that can be deleted simultaneously. The inventive memory arrangement also includes a number of at least one read memory sector. The read memory sectors also include an amount of the memory cells. Different delete or read memory sectors have no common memory cells. The memory cell arrangement is designed such that the number of memory cells of a delete memory sector does not concur with the number of memory cells of a read memory sector. Each memory cell is, however, arranged in a read memory sector and a delete memory sector.

The delete line may, for instance, be adapted to be connected parallel to the memory cells of a delete memory sector. The number of memory cells of a delete memory sector then corresponds to the number of memory cells that can be deleted simultaneously. The read lines are each adapted to be connected parallel to the memory cells of a read memory sector. The number of read memory cells that are adapted to be connected parallel determines the read access time to the memory arrangement, whereas the number of memory cells per delete memory sector determines the delete granularity. Since the delete memory sectors and the read memory sectors are of different sizes, the read access time and the programmability may be selected pursuant to the respective requirements.

In one embodiment, EEPROM cells or flash memory cells are used. They have the advantage that they constitute non-volatile memories that are programmable. Each memory cell has a control gate, a source, and a drain.

The sources of the memory cells of a delete memory sector are connected in parallel. Correspondingly, the drains of the memory cells of a delete memory sector are connected in parallel. The delete line is, via a delete switch, either connected with the sources or with the drains of a delete memory sector. If the delete switch is switched through, the delete memory cells of a memory sector can be deleted simultaneously. The number of memory cells within a delete memory sector accordingly corresponds to the minimum number of memory cells that can simultaneously be controlled and deleted via the delete line.

The read line is, in one embodiment via a read switch, either connected with the sources or with the drains of a read memory sector. It is, however, also conceivable to separate the read line from the memory cells by a delete switch. This is because the delete switch is configured to switch higher voltages than the read switch. The disadvantages of the delete switch, in particular the slower controlling, have the effect that smaller and faster read switches are used. The read memory sectors are consequently controlled via the read switches while the delete memory sectors are controlled via the delete switches.

In one embodiment, the delete memory sectors each include a plurality of read memory sectors. A delete memory sector is consequently distinctly larger than a read memory sector. Such an arrangement is of advantage if the demanded read rate is relatively high while the requirement to the programming rate is relatively low. The large delete memory sectors indeed have as a consequence that large sectors have to be deleted completely to reprogram individual regions thereof. The number of delete switches required for controlling the delete sectors can, however, be reduced with this construction, so that the memory arrangement is smaller and more cost-efficient. On the other hand, no compromises have to be accepted with the read rate in this case.

The organization of the memory cells in nested delete and read memory sectors simplifies the controlling of the individual sectors. If it is known in which read memory sector a cell is contained, it is also known in which delete memory sector it is located. This is because all memory cells of a read memory sector are contained in exactly one delete memory sector. The addressing of the memory cells is consequently less complex.

The read switches of the read memory sectors contained in a delete memory sector are each connected in parallel via a subglobal line, and the subglobal line is connected to the delete or read line, respectively, via a delete switch. The use of a subglobal line is necessary if one and the same line acts as delete and read line. In this case, the delete and read signal is output to the memory cells via the subglobal line.

The read memory sectors may each include a plurality of delete memory sectors. With this memory arrangement, greater importance is attached to the delete granularity than to the read rate. Applications in which smaller data packets are exchanged, i.e. deleted and programmed, while the memory can be read out relatively slowly are absolutely conceivable. In this case it is of advantage that as few memory cells as possible have to be deleted before new data can be written in the memory cells. A relatively small delete memory sector is of advantage in this case. If one single line acts as global delete and read line, the delete switches of the delete memory sectors contained in a read memory sector are each connected in parallel via a subglobal line, and the subglobal line is connected to the delete/read line via one single read switch.

An integrated circuit having a memory arrangement according to one embodiment illustrated in FIG. 1 includes to separate lines for deleting or reading, respectively, of memory cells. The read line 10 and the delete line 20 run parallel to each other. They include a plurality of memory cells 50*ax*, 50*bx*, 50*cy*, 50*dy*. The sources of the memory cells 50*ax* are each connected with each other. A read switch 30*a* is connected between the read line and the memory cells 50*ax*. The memory cells 50*ax* form a read memory sector. The memory cells 50*bx*, 50*cy*, and 50*dy* also each form a read memory sector. This is because each of the memory cell groups 50*bx*, 50*cy*, and 50*dy* is adapted to be connected to the read line via exactly one corresponding read switch 30*b*, 30*c*, and 30*d*. EEPROM cells are used as memory cells.

The sources and the drains of the memory cells can, as a rule, be exchanged without influencing the functionality of the memory arrangement.

For reading out a selected memory cell, a read voltage is applied to the (not illustrated) gate of the EEPROM memory cell. All memory cells of the read memory sector containing the selected memory cell are connected with the read line 10 by the corresponding read switch. The remaining memory cells are electrically insulated from the read line 10. The drains of the memory cells of the read memory sector containing the selected memory cell are connected with the ground via a (not illustrated) switch. A read-out voltage is applied to the read line, and the current through the read line is collected. If the floating gate of the memory cell to be read out does not contain any charge carriers, current flows from the read line through the selected memory cell. The remaining memory cells do not allow for any current flow.

The drains of the memory cells 50*ax* and 50*bx* are short-circuited with one another and jointly connected with the delete line 20 via the delete switch 40*x*. Correspondingly, the drains of the memory cells 50*cy* and 50*dy* are short-circuited with each other and jointly connected with the delete line 20 via the delete switch 40*y*. The memory cells 50*ax* and 50*bx* jointly form a delete memory cell sector. They can be deleted simultaneously in that the delete switch is closed and a delete voltage is applied to the delete line. Since the memory cells 50*ax* and 50*bx* are connected in parallel, the same delete voltage is present at the drain of each of the memory cells 50*ax* and 50*bx*. The delete voltage causes the floating gates of each connected memory cell to be discharged.

Figure 2:
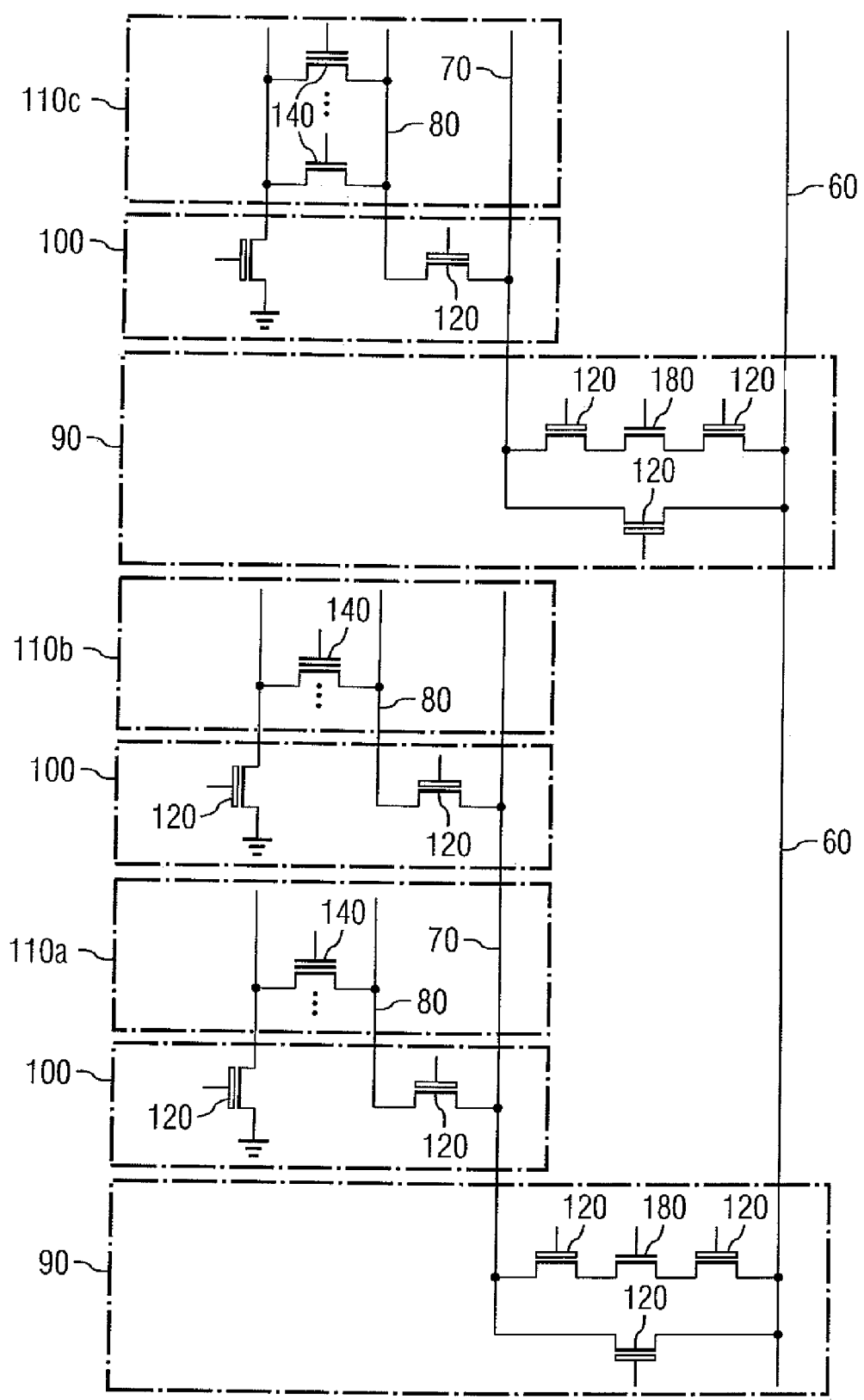
FIG. 2 illustrates a memory arrangement of a second preferred embodiment of the present invention.

Another embodiment illustrated in FIG. 2 includes, contrary to the first embodiment, only one global line 60 that is used both as read line and as delete line. The global delete/read line 60 is connected to a subglobal line 70 via a read switch group 90. Parallel to the subglobal line 70 are provided delete switches 100 which in turn connect the subglobal line 70 with the local lines 80 of the delete memory sectors 110*a*, 110 *b*, and 110*c*.

Figure 3:
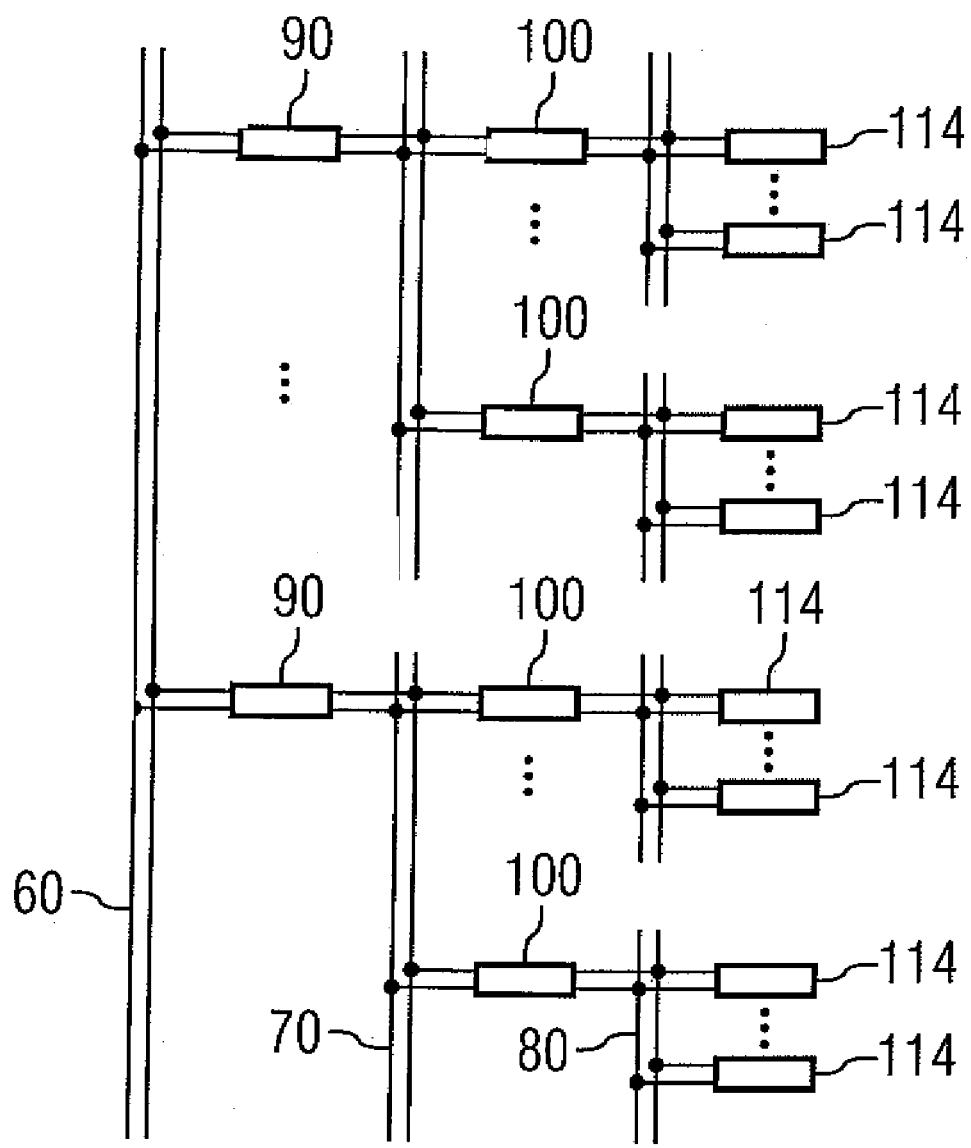
FIG. 3 illustrates a schematic representation of the memory arrangement of FIG. 2.

FIG. 3 schematically illustrates the corresponding arrangement of the read switches 90, the delete switches 100, and the individual memory cells 114. It may be gathered that a tree-like structure results, the stem of which is the global line 60. The memory cells 114 connected to the global line 60 via one single read switch 90 form the read memory sectors. The memory cells 114 connected to a subglobal line 70 via one single delete switch 100 form the delete memory sectors. Each read memory sector has a plurality of delete memory sectors.

FIG. 2 further illustrates the more exact structure of individual components. The delete switch 100 merely consists of a high-voltage transistor 120. High-voltage transistors 120 are those transistors that are adapted to connect and isolate the voltage required for deleting the memory cells.

The read switch 90 includes both high-voltage transistors 120 and a low-voltage transistor 130. The low-voltage transistor 130 is connected with source and drain between two high-voltage transistors 120. These high-voltage transistors 120 protect the low-voltage switch from high voltages if the global line 60 is operated as delete line. The high-voltage transistor 120 that is connected in parallel to the low-voltage transistor 130 conducts the high voltage from the global line 60 through to the subglobal line 70.

If, however, the global line 60 is operated as read line, the parallel-connected high-voltage transistor of the read switch 90 is open. This means it insulates the global line 60 from the subglobal line 70. The remaining high-voltage transistors 120 of the read switch are closed, so that only the low-voltage transistor 130 has to be switched for conducting through the low voltage. Also the remaining high-voltage transistors 120 between the subglobal line 70 and the local lines 80 are switched through in read operation. Thus, the read voltage gets to the individual memory cells 140, so that the read current to be measured flows through the global line 60. A plurality of memory cells 140 are each connected with the source or the drain to the local line 80. The opposite connection (drain or source) is connected to the ground via a high-voltage transistor 120 in read operation. EEPROM cells are used as memory cells.

Figure 4:
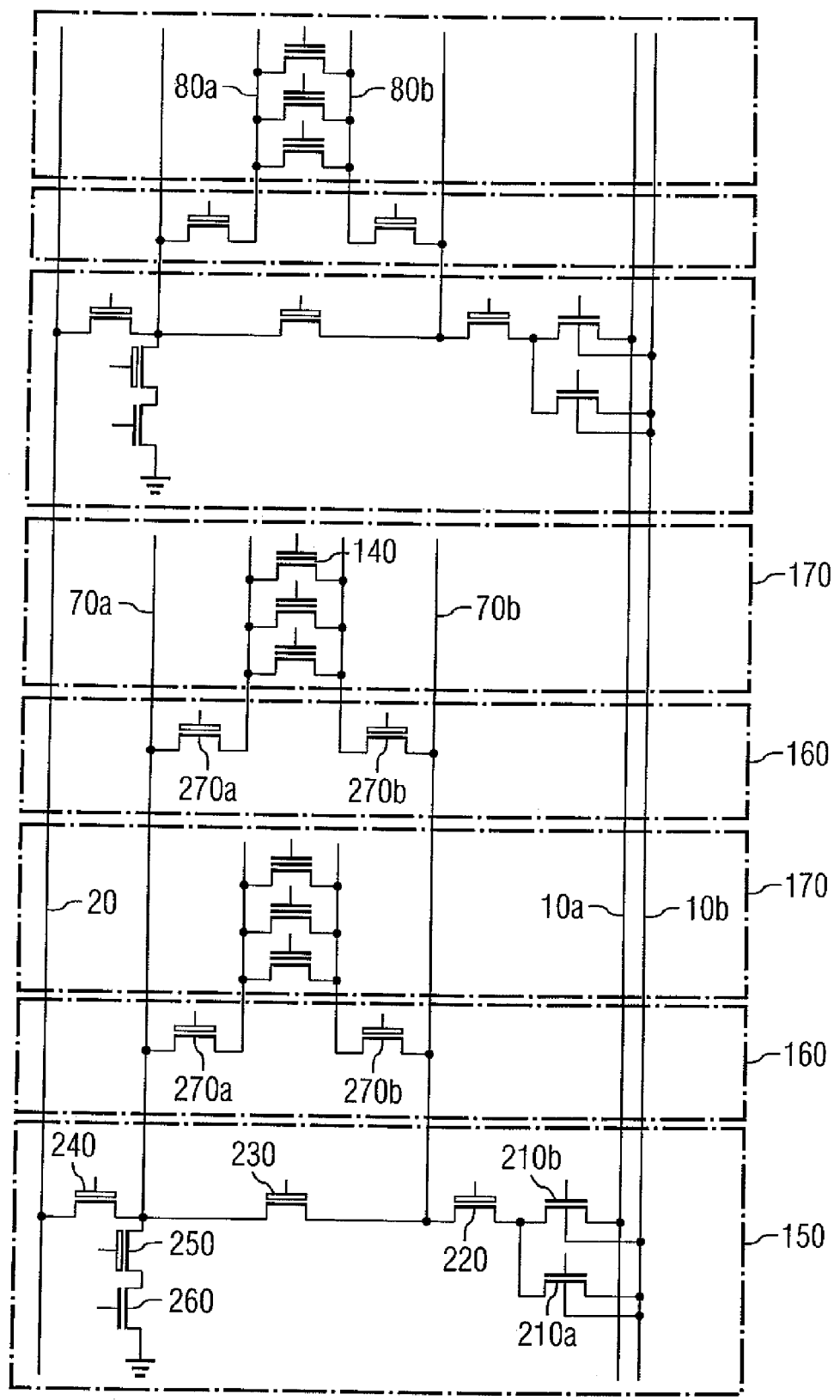
FIG. 4 illustrates a memory arrangement of a third preferred embodiment of the present invention.

FIG. 4 illustrates another embodiment of the present invention. This embodiment is again a memory arrangement with separate delete and read lines. A global delete line 20 is provided. Furthermore, two different read lines 10*a* and 10*b* are illustrated in FIG. 4.

In addition to the global delete line 20, a subglobal delete line 70*a* is illustrated in FIG. 4. A high-voltage transistor 240 is provided, which separates—operated as a switch—the global delete line 20 from the subglobal delete line 70*a*. The high-voltage transistor 240 is a component of a coupling region 150 for coupling the delete and read lines 10*a*, 10*b*, and 20 to the subglobal lines 70*a* and 70*b*. A further high-voltage transistor 230 is provided to insulate the global delete line 20 and the subglobal delete line 70*a* from the global and subglobal read lines 10*a*, 10*b*, and 70*b*.

The subglobal delete line 70*a* is again connected with local delete lines 80*a* via one or a plurality of high-voltage transistors 270*a*. A tree structure similar to that illustrated in FIG. 3 again results for the global delete line 20, the subglobal delete line 70*a*, and the local delete line 80*a*. For deleting, individual delete memory sectors 170 can be selected via the high-voltage transistors 240 and 270a. A plurality of memory cells 140 are connected parallel to the local delete line 80a in a delete memory sector 170.

A corresponding structure results for the read branch of the circuit of FIG. 4. Instead of one read line, however, two read lines 10a and 10b are provided, which are each connected to a high-voltage switch 220 via a low-voltage switch 210a and 210b. This high-voltage switch 220 connects the read lines 10a and 10b with a subglobal read line 70b. Each delete memory sector is connected with the subglobal read line 70b via a high-voltage transistor 270. In read operation, these high-voltage transistors 270b are switched through, so that several (two) delete sectors 170 form one read sector. The local read line 80b connects the memory cells 140 of one delete sector 170 with one another. The subglobal read line 70b connects the read lines 80b of a plurality of delete sectors 170 with one another.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory comprising:
a delete/read line;
a delete memory sector having memory cells;
a read memory sector having memory cells; and
wherein the number of memory cells of the delete memory sector is different from the number of memory cells of the read memory sector.

2. The integrated circuit of claim 1, comprising:
wherein the delete delete/read line comprises a separate read line for reading out the memory cells and a separate delete line for deleting the memory cells.

3. The integrated circuit of claim 1, wherein the memory cells each comprise a control gate, a source, and a drain, wherein the sources and/or drains of the memory cells of a delete memory sector are each configured to be connected with the delete/read line via a delete switch, and wherein the sources or drains of the memory cells of a read memory sector are each adapted to be connected with the delete/read line via a read switch.

4. The integrated circuit of claim 3, wherein the delete memory sectors each comprise a plurality of read memory sectors.

5. The integrated circuit of claim 3, wherein the read memory sectors each comprise a plurality of delete memory sectors.

6. The memory cell arrangement of claim 3, comprising wherein the delete switches of the delete memory sector contained in a read memory sector are each connected in parallel via a subglobal line, and wherein the subglobal line is connected to the read line via one single read switch.

7. The memory cell arrangement of claim 3, comprising wherein the read switches of the read memory sectors contained in a delete memory sector are each connected in parallel via a subglobal line, and the subglobal line is connected to the delete line via one single delete switch.

8. The memory cell arrangement of claim 1, comprising wherein two separate lines are provided as delete line and as read line, wherein the source of the memory cells of a delete memory sector are adapted to be connected with the delete line via a delete switch, and wherein the drains of the memory cells of a read memory sector are configured to be connected with the read line via a read switch.

9. The integrated circuit of claim 1, comprising wherein the memory cells are non-volatile memory cells.

10. A memory arrangement, comprising:
a plurality of memory cells;
a delete line for deleting the memory cells;
a read line for reading out the memory cells, wherein either separate lines are provided as delete line and as read line, or the same line is provided both as delete line and as read line;
at least one delete memory sector with memory cells;
at least one read memory sector with memory cells;
wherein the memory cell arrangement is configured such that the delete line can be connected to the respective memory cells of a delete memory sector;
the read line can be connected to the respective memory cells of a read memory sector; and
the number of memory cells of at least one delete memory sector is different from the number of memory cells of at least one read memory sector.

11. The memory arrangement of claim 10, comprising wherein the memory cells are non-volatile memory cells.

12. The memory arrangement of claim 10, wherein the memory cells each comprise a control gate, a source, and a drain, wherein the sources and/or drains of the memory cells of a delete memory sector are each configured to be connected with the delete line via a delete switch, and wherein the sources or drains of the memory cells of a read memory sector are each adapted to be connected with the read line via a read switch.

13. The memory arrangement of claim 12, comprising wherein the delete switches of the delete memory sector contained in a read memory sector are each connected in parallel via a subglobal line, and wherein the subglobal line is connected to the read line via one single read switch.

14. The memory arrangement of claim 12, comprising wherein the read switches of the read memory sectors contained in a delete memory sector are each connected in parallel via a subglobal line, and the subglobal line is connected to the delete line via one single delete switch.

15. The memory arrangement of claim 12, comprising wherein two separate lines are provided as delete line and as read line, wherein the source of the memory cells of a delete memory sector are adapted to be connected with the delete line via a delete switch, and wherein the drains of the memory cells of a read memory sector are adapted to be connected with the read line via a read switch.

16. The memory arrangement of claim 12, comprising wherein two separate lines are provided as delete line and as read line, wherein the sources of the memory cells of a delete memory sector are adapted to be connected with the delete line via a delete switch, and wherein the sources of the memory cells of a read memory sector are adapted to be connected with the read line.

17. The memory arrangement of claim 12, comprising wherein two separate lines are provided as delete line and as read line, wherein the drains of the memory cells of a delete memory sector are adapted to be connected with the delete line via a delete switch, and wherein the sources of the memory cells of a read memory sector are adapted to be connected with the read line via a read switch.

18. The memory arrangement of claim 12, comprising wherein two separate lines are provided as delete line and as read line, wherein the drains of the memory cells of a delete memory sector are adapted to be connected with the delete line via a delete switch, and wherein the drains of the memory cells of a read memory sector are adapted to be connected with the read line.

19. The memory arrangement of claim 10, wherein the delete memory sectors each comprise a plurality of read memory sectors.

20. The memory arrangement of claim 10, wherein the read memory sectors each comprise a plurality of delete memory sectors.

21. A method for reading out memory cells of the memory arrangement of claim 10, comprising:
   selecting the memory cell to be read out;
   closing the read switch that connects the read line with the selected memory cell; opening the remaining read switches that connect the read line with the read memory sectors that do not comprise the selected memory cell;
   closing of delete switches that are connected between the read line and the selected memory cell;
   applying a read voltage to the gate of the memory cell;
   applying a read voltage to the read line to read out the selected memory cell; and
   collecting the current flowing through the read line.

22. A method for operating a memory arrangement comprising:
   deleting the memory arrangement to include a delete/read line;
   a delete memory sector having memory cells;
   a read memory sector having memory cells;
   wherein the number of memory cells of the delete memory sector is different from the number of memory cells of the read memory sector.
   selecting the delete memory sector to be deleted;
   closing a delete switch that connects the delete line with the selected delete memory sector;
   opening the remaining delete switches that connect the delete line with the non-selected delete memory sectors;
   ensuring that the delete line is not short-circuited with any open read switch, so that the read switch is not destroyed by the voltage to be applied to the delete line; and
   applying a delete voltage to the delete line to delete the memory cells of the selected memory sector.

23. The method of claim 22, wherein the read switch comprises a low-volt switch.

24. The method of claim 23, wherein the process of ensuring comprises the opening of a high-volt switch that is arranged between the low-volt switch and the delete sector.

* * * * *